United States Patent
Morse et al.

(10) Patent No.: US 6,600,375 B1
(45) Date of Patent: Jul. 29, 2003

(54) FLOATING SOURCE MODULATOR FOR SILICON CARBIDE TRANSISTOR AMPLIFIERS

(75) Inventors: Alfred W. Morse, Ellicott City, MD (US); Gregory A. Arlow, Southampton, NJ (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/952,730

(22) Filed: Sep. 12, 2001

(51) Int. Cl.[7] .................................................. H03F 3/04
(52) U.S. Cl. ......................... 330/296; 330/51; 330/285
(58) Field of Search ......................... 330/51, 285, 290, 330/296

(56) References Cited

U.S. PATENT DOCUMENTS 3,991,381 A * 11/1976 Sechi .......................... 330/227
4,250,462 A * 2/1981 Iwer et al. ................... 330/296
5,285,369 A * 2/1994 Balakrishnan ................ 363/49
5,298,869 A * 3/1994 Jinich et al. ................. 323/280

* cited by examiner

Primary Examiner—Terry D. Cunningham
Assistant Examiner—Quan Tra
(74) Attorney, Agent, or Firm—Birch, Stewart, Kolasch & Birch, LLP

(57) ABSTRACT

A source modulator circuit for an amplifier including a silicon carbide (SiC) static induction transistor (SIT) having a grounded gate, a source and a drain, includes: a source bias voltage supply connected to the source of the transistor; a drain voltage supply connected between the source and drain of the transistor; and a shunt circuit for directing current from the drain voltage supply around the source voltage supply to said source; whereby power dissipation by the source voltage supply is minimized. The shunt circuit includes a field effect transistor (FET) switch responsive to a control signal from a gated feedback operational amplifier for turning on the quiescent current of the SIT and setting the voltage applied to the source to a desired source voltage level.

26 Claims, 5 Drawing Sheets

FLOATING SOURCE MODULATOR FOR SILICON CARBIDE TRANSISTOR AMPLIFIERS

FIELD OF THE INVENTION

The present invention relates to a modulator circuit for a common gate silicon carbide (SiC) transistor amplifier. More specifically, the present invention relates to an adjustable, pulsed, feedback-controlled bias voltage supply for a common gate SiC transistor amplifier for providing increased efficiency and lower power dissipation as compared to traditional shunt-to-ground source regulators known heretofore.

RELATED ART

FIG. 1-A shows a conventional configuration for biasing a static induction transistor (SIT) 12, typically a SiC transistor, in a common gate configuration. A relatively high voltage power supply 20 is connected between the drain and ground through a coil RFC-1, usually with a switch 21, which pulse enables the SIT device 12. Normal operation requires the gate to be biased negative with respect to the source, and this is accomplished with a separate low voltage supply 18, nominally of about 9 volts in series with RF choke coil RFC-2. Because different transistors typically require slightly different source to gate bias for optimum operation, the low voltage output of source 18 is adjustable, usually from 7 to 9 volts. It can be seen that the drain current $I_D$ comes from the high voltage supply 20, but it also flows through the source supply 18 dissipating considerable power in it. The drain to source voltage is only 81 volts, but the current is supplied from the 90 volt high voltage supply 20. The power dissipated in the 9-volt source supply 18 is thus wasted. In high power modules, multiple transistors are connected in parallel, with a common high voltage power supply, and individually adjustable source biases.

The problems with the prior art are:
1. Wasted power in the source bias supply;
2. A high voltage drain switch, which is bulky and slow.

SUMMARY OF THE INVENTION

Accordingly, it is a primary aspect of the present invention to provide a circuit and method for minimizing power dissipation by the source power supply in a static induction transistor operating in a common gate circuit configuration.

It is a further aspect of the present invention to provide a modulator for a static induction transistor amplifier which is compact and rapidly switchable between operating states.

It is still another object of the present invention to provide an electronically adjustable source bias voltage for a common gate static induction transistor.

The aspects of the present invention are fulfilled by providing a source modulator circuit for a static induction transistor (SIT) amplifier including a silicon carbide (SiC) transistor having a grounded gate, a source and a drain comprising: a source voltage supply connected between the source of the transistor and ground (gate); a drain voltage supply connected between the source and drain; and a circuit for directing current from the drain voltage supply around the source voltage supply to said source, whereby power dissipation by the source voltage supply is minimized. The current directing circuit includes a source modulator circuit including a semiconductor switch which is responsive to a control signal for turning on quiescent current in the SIT. The semiconductor switch in a preferred embodiment comprises a Field Effect Transistor (FET).

The source voltage supply may be clamped to the source of the SIT by a zener diode. Switching performance and adjustability of the SIT may also be enhanced by providing a pair of series-connected diodes between the source of SiC transistor and the drain of the FET.

Further scope of applicability of the present invention will become apparent from the detailed description provided hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more readily understood when the detailed description provided hereinafter is considered in conjunction with the following drawings, and wherein:

FIG. 1-B is an operational circuit schematic showing the improved voltage bias supply arrangement of the present invention;

DETAILED DESCRIPTION OF THE PRESENT INVENTION

Figure 1A:
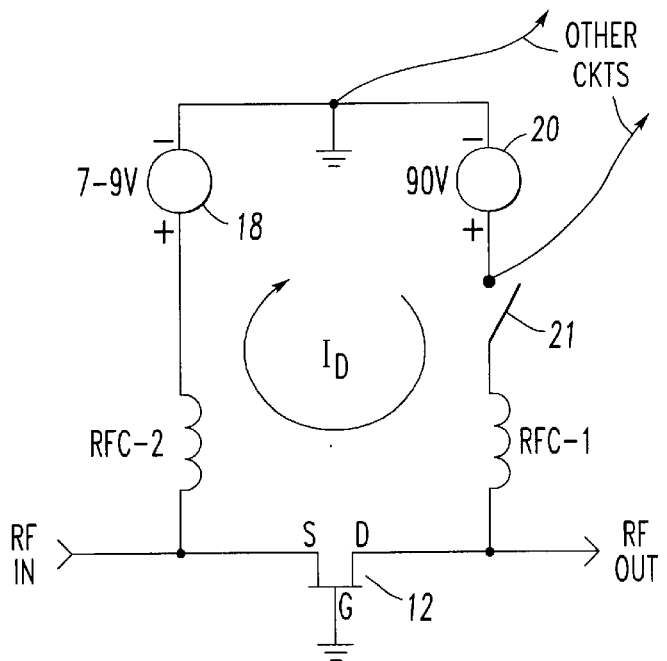
FIG. 1-A is an operational circuit schematic illustrative of a prior art common gate voltage biasing circuit for a common gate transistor amplifier.
Figure 1B:
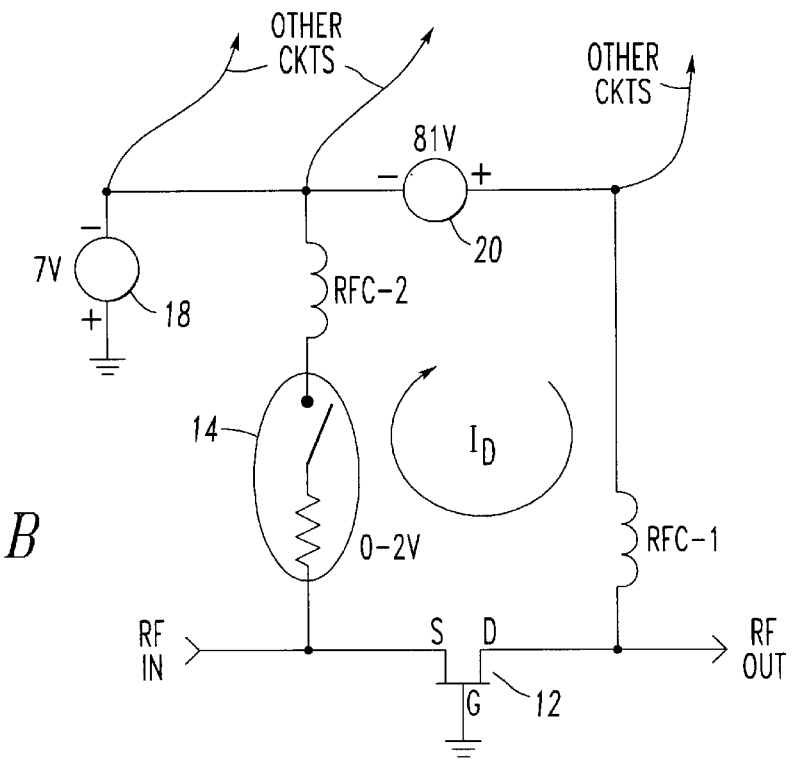

Reference is now made to FIG. 1B. There a floating high power supply 20, providing a drain to source voltage $V_{ds}$, is used and connected from drain to source of a silicon carbide (SiC) static induction transistor (SIT) 12 through coils. RFC-1 and RFC-2. The source to gate voltage is derived with a separate low voltage supply 18, as before, but now the current $I_D$ does not flow through the supply 18, or waste power in it. For the same device current $I_D$ and $V_{ds}$, a lesser high voltage supply is needed, typically 81 volts. The reduction in DC power required is approximately the 81 to 90 volt ratio. The low voltage supply 18 is now used only to provide a voltage reference to the source.

The SIT device 12 is also now pulsed on with a low voltage shunt switch 14 (a field effect transistor or simply FET) between the reference low voltage supply 18 and the SIT source (S). The actual voltage from source (S) to gate (G) can be made adjustable by designing the switch 14 to go from an open circuit to a fixed voltage drop. Large numbers of circuits can be added in parallel, using single high and low voltage power supplies. Adjustability for differences in the bias requirements of the SIT device 12 is accomplished by adjustment in the individual low voltage switch levels of the switch 14.

Figure 2:
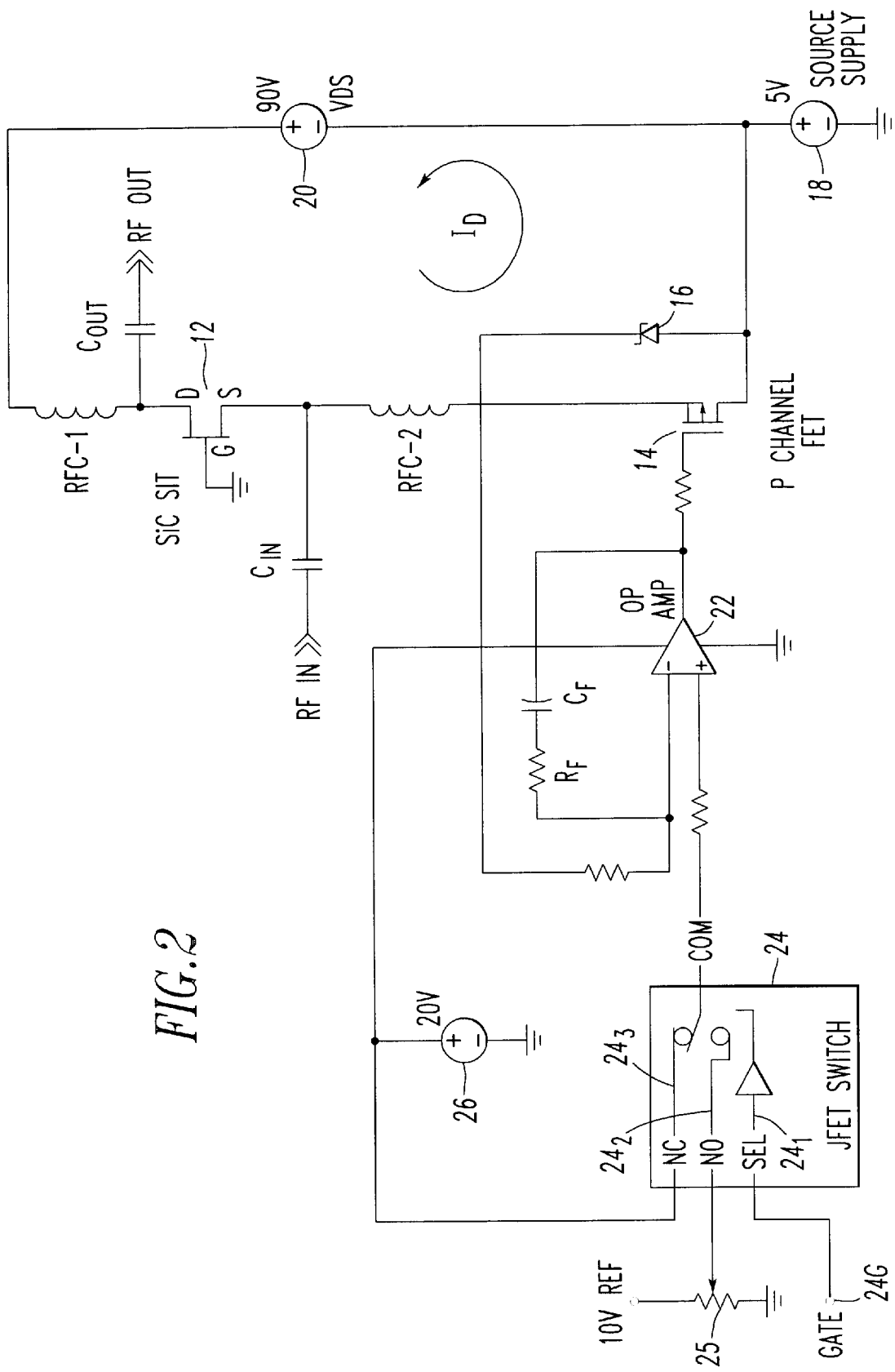
FIG. 2 is a floating source modulator circuit in accordance with the present invention employing the improved voltage bias features of FIG. 1-B.
Figure 3:
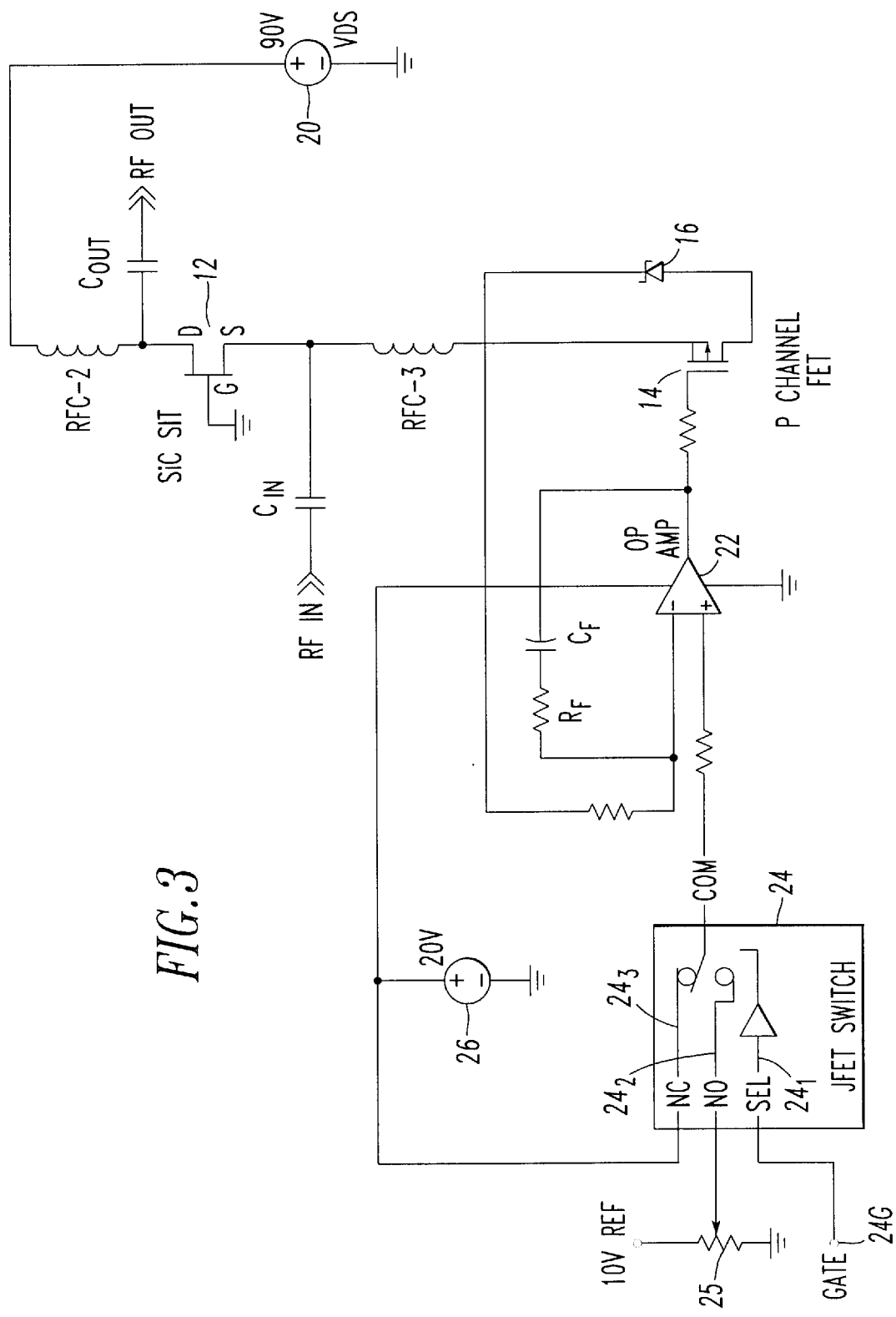
FIG. 3 is a circuit depicting the source modulator shown in FIG. 2 without a floating source voltage.

In addition to the floating high power supply 20 for the SIT 12, the subject invention also consists of a source modulator for the SIT 12 which is depicted in FIGS. 2 and 3. FIG. 2 discloses a floating source modulator, while FIG. 3 discloses a source modulator without a floating source voltage. With respect to the circuitry shown in FIG. 2, a JFET switch 24 is connected to a feedback amplifier comprised of op amp 22 which in turn controls a P channel FET switch 14 which is connected between source bias supply 18 and the source of SIT 12 via the RF choke RFC-2. In the off state, JFET switch 24 operates to turn FET switch 14 off as well. Leakage current through the SiC SIT 12 flows through coil RFC-2 and a zener diode clamp 16 to the low voltage source supply 18 passively pinching transistor 12 off. The source (S) to gate (G) breakdown voltage of SiC SIT 12 must be rated to withstand the zener diode 16 drop plus the source supply voltage 18. Minimum pinch-off of SIT 12 must also be below the zener voltage level so that pinch-off occurs should the source supply voltage 18 fail with the drain supply voltage 20 still present (safe failure mode).

The JFET switching circuit 24 is biased by a potentiometer 25 and is gated on and off through gate terminal 24G connected to SET terminal 24-1. Output pulses are generated by switching between NO (normally open) terminal 24-2 and NC (normally closed) terminal 24-3. Biasing voltage is provided to op amp 22 by voltage source 26. To turn on quiescent current in the SIT 12, the JFET 24 switch switches to the setpoint at terminal 24-1, and the op amp 22 slews the P channel FET 14 to the desired SIT source voltage level based upon the RC feedback components $R_F$, $C_F$ connected in series around the op amp 22. Current drawn from the drain supply 20 flows through RFC-1, the SIT 12, RFC-2, the P channel shunt FET 14 and back to the negative (−) side of the drain supply 20 minimizing shunt power loss from that of the circuit shown in FIG. 3, where the shunt switch 14, i.e. the P channel FET, is connected to ground. RF input is bracketed by the SIT source gating.

Figure 4:
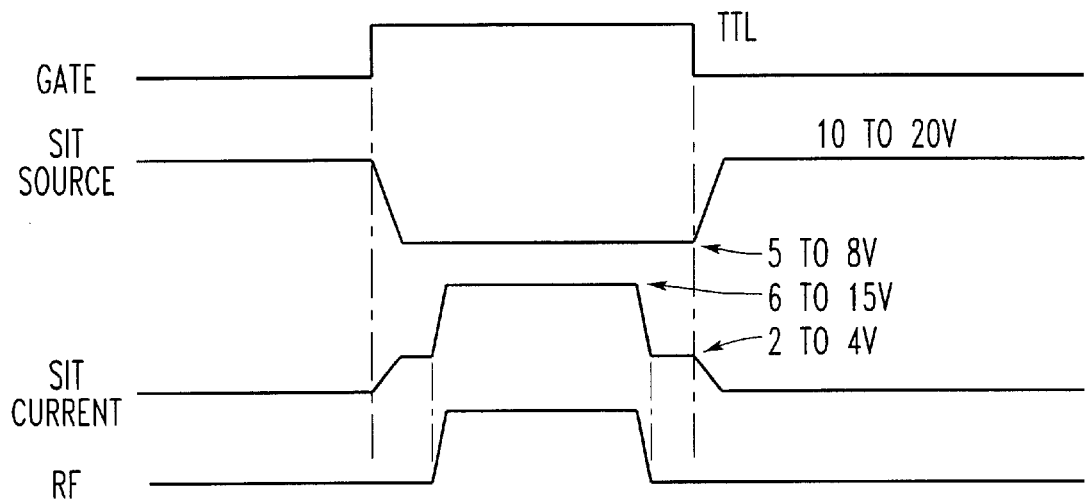
FIG. 4 is timing diagram depicting operation of the floating source modulator of FIG. 2.
Figure 5:
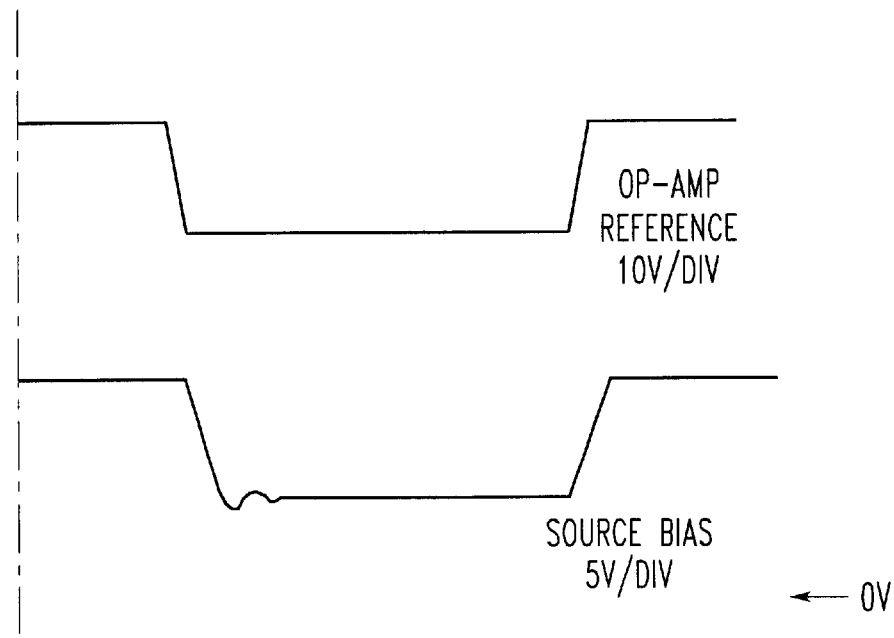
FIG. 5 is a graph demonstrating the improved results achieved with the floating source modulator of the present invention.

Timing relationships are shown in FIG. 4, as are representative voltage and current levels for the SIT source. Actual circuit performance for a resistive load in place of the SIT is shown in FIG. 5. Zener clamp to 6-volt bias was slewed in ~100 ns. The critical component in achieving slew rate speed was a high current high-speed op amp 22 in order to charge the 1400 pf P channel FET 14 gate rapidly (135 mA, 100 MHz gain bandwidth op amp).

Figure 6:
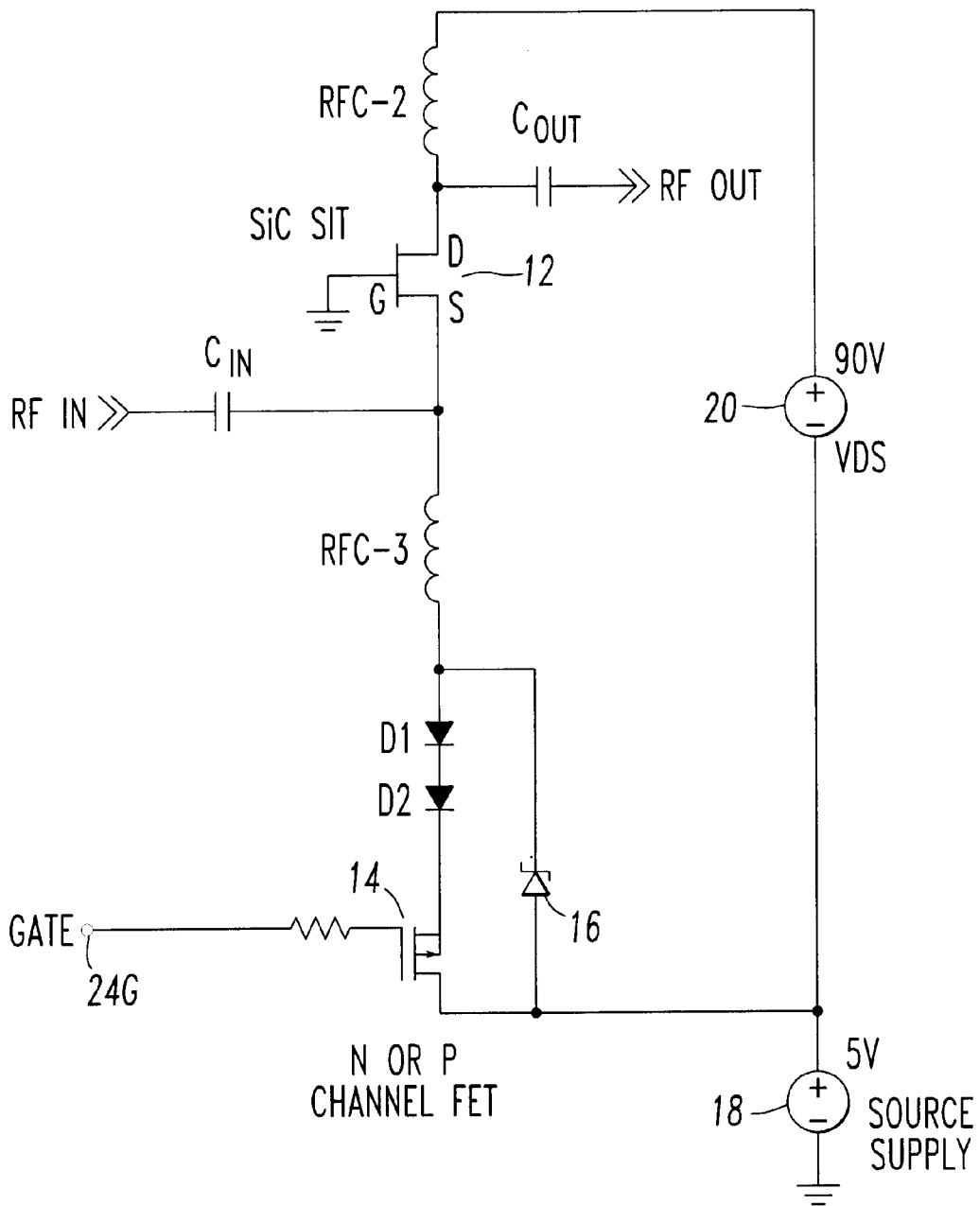
FIG. 6 depicts an alternative embodiment of an adjustable source switching circuit including series connected diodes.

Circuit alternates to the above include the use of a pair of diodes D1, D2 connected in series with the controlled FET switch 14 and which can be shorted to set individual SIT device bias levels as shown in FIG. 6 in place of the voltage feedback circuit adjustment shown in FIG. 2. However, this provides discrete setpoint steps, not continuously adjustable ranges which can be provided by the potentiometer 25 shown in FIGS. 2 and 3.

Another circuit embodiment would be use of an ASIC, not shown, to integrate as many of the circuit functions shown in FIG. 2 into a single component in order to enhance regulator speed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transistor amplifier, comprising:
   a transistor having a grounded gate, a source and a drain;
   a relatively low source bias voltage supply connected between the source and gate;
   a relatively high voltage supply connected between the source and drain; and
   a source modulator for turning on a quiescent current in the transistor, setting a voltage applied to the source from said bias voltage supply to a desired source voltage level, and for directing current from the relatively high voltage supply between the source and drain around the source bias voltage supply, whereby power dissipation by the relatively low source bias voltage supply is minimized.

2. The transistor amplifier of claim 1 wherein said source modulator includes shunt regulator which controls conductivity of the transistor and which floats the relatively high voltage supply on top of the relatively low source bias voltage supply.

3. The transistor amplifier of claim 2 wherein the transistor comprises a static induction transistor.

4. The transistor amplifier of claim 3 wherein said static induction transistor comprises a silicon carbide static induction transistor.

5. The transistor amplifier of claim 2 wherein said source modulator includes a pulsed control circuit including a feedback amplifier for providing an adjustable controlled bias voltage to the source.

6. The transistor amplifier of claim 5 wherein said pulsed control circuit includes a controlled switch connected between the source bias voltage supply and the source and being responsive to a control signal from said pulsed control circuit for turning on quiescent current in the transistor.

7. The transistor amplifier of claim 6 wherein the controlled switch comprises a semiconductor switch.

8. The transistor amplifier of claim 7 wherein the semiconductor switch comprises a transistor.

9. The transistor amplifier of claim 7 wherein the semiconductor switch comprises a field effect transistor.

10. The transistor amplifier of claim 6 wherein the voltage supplies have a common circuit node and additionally including a voltage regulator between the common circuit node and one terminal, a source terminal or a drain terminal, of the static induction transistor.

11. The transistor amplifier of claim 10 wherein the voltage regulator comprises a zener diode clamp.

12. The transistor amplifier of claim 7 and additionally including a zener diode connected in parallel with semiconductor switch between the source bias voltage supply and the source.

13. The source modulator circuit of claim 7 further including a pair of series connected diodes between the source and the semiconductor controlled switch.

14. A grounded gate transistor amplifier, comprising:
    a transistor having a gate, a source and a drain, wherein the gate is connected to ground, an input signal is applied to the source, and an output signal is provided at the drain;
    a semiconductor switch device connected between the source of the transistor and ground;
    a drain to source supply voltage connected between the drain of the transistor and ground; and
    a source modulator for turning on a quiescent current in the transistor and including a pulsed amplifier having a gated reference voltage applied to an input thereof for controlling the conductive state of the semiconductor switch device and setting a voltage at the source to a desired voltage level.

15. The transistor amplifier of claim 14 wherein the transistor comprises a static induction transistor.

16. The transistor amplifier of claim 14 wherein aid pulsed amplifier circuit comprises a feedback amplifier.

17. The transistor amplifier of claim 14 wherein said semiconductor switch comprises a transistor.

18. The source modulator circuit of claim 15 wherein said circuit includes a semiconductor switch responsive to a control signal from a source modulator for turning on quiescent current to the static induction transistor.

19. The source modulator circuit of claim 18 wherein the semiconductor switch comprises a field effect transistor.

20. The source modulator circuit of claim 19 wherein there is further provided a zener diode connected between the source voltage supply and the source.

21. The source modulator circuit of claim 19 further including a pair of series connected diodes between the source of the SIC and a drain of the FET.

22. A source modulator circuit for a static induction transistor amplifier having a grounded gate, a source and a drain comprising:
   a source voltage supply connected between the source and gate of the static induction transistor;
   a drain voltage supply connected between the source and drain of the static induction transistor; and
   a shunt circuit for directing current from the drain voltage supply around the source voltage supply to said source, whereby power dissipation by the source voltage supply is minimized.

23. A method, of driving a grounded gate transistor amplifier including a transistor having a gate, a source and a drain, wherein an input signal is applied to the source and an output signal is provided at the drain, comprising the steps of:
   a) connecting a semiconductor switch device between the source of the transistor and ground;
   b) connecting a drain to source supply voltage between the drain of the transistor and ground; and
   c) turning on a quiescent current in the transistor by a source modulator including a pulsed amplifier having a gated reference voltage applied to an input thereof for controlling the conductive state of the semiconductor switch device and setting a voltage at the source to a desired voltage level.

24. A method of driving a grounded gate amplifier including a static induction transistor having a gate, a source and a drain, comprising the steps of:
   a) connecting a source to gate supply voltage between the source and grounded gate of the static induction transistor;
   b) connecting a drain to source supply voltage between the source and drain of the static induction transistor;
   c) connecting a controlled switch between the source and a source to gate supply voltage source;
   d) turning on a quiescent current in, the transistor and setting a voltage applied to the source to a desired source voltage level via a source modulator;
   e) floating a drain to source supply voltage source on top of the source to gate supply voltage source; and
   f) shunting current from the drain voltage supply around the source voltage supply to said source, whereby power dissipation by the source voltage supply is minimized.

25. The transistor amplifier of claim 14 and additionally including an inductance coil between the source of the transistor and the semiconductor switch.

26. The transistor amplifier of claim 14 and additionally including an inductance coil between the drain of the transistor and the drain to source supply voltage.

\* \* \* \* \*